(12) United States Patent
Neeman et al.

(10) Patent No.: US 8,924,829 B2
(45) Date of Patent: Dec. 30, 2014

(54) DEVICE AND METHOD FOR TURBO-ENCODING A BLOCK OF DATA

(75) Inventors: Yuval Neeman, Mazkeret Batya (IL); Eliya Babitsky, Caesaria (IL); Noam Zach, Ganey Tikva (IL)

(73) Assignee: Freescale Semiconductor, Inc., Austin, TX (US)

( * ) Notice: Subject to any disclaimer, the term of this patent is extended or adjusted under 35 U.S.C. 154(b) by 192 days.

(21) Appl. No.: 13/391,296

(22) PCT Filed: Aug. 31, 2009

(86) PCT No.: PCT/IB2009/053787
§ 371 (c)(1),
(2), (4) Date: Feb. 20, 2012

(87) PCT Pub. No.: WO2011/024032
PCT Pub. Date: Mar. 3, 2011

(65) Prior Publication Data
US 2012/0151295 A1 Jun. 14, 2012

(51) Int. Cl.
*H03M 13/03* (2006.01)
*H03M 13/29* (2006.01)
*H03M 13/00* (2006.01)

(52) U.S. Cl.
CPC ...... *H03M 13/2996* (2013.01); *H03M 13/2903* (2013.01); *H03M 13/6544* (2013.01)
USPC ..... 714/786; 714/752; 714/755; 714/E11.032

(58) Field of Classification Search
USPC .......................................... 714/786, 755, 752
See application file for complete search history.

(56) References Cited

U.S. PATENT DOCUMENTS

| | | | |
|---|---|---|---|
| 5,881,073 A | 3/1999 | Wan et al. | |
| 7,392,462 B2 | 6/2008 | Kwak | |
| 7,519,896 B2 * | 4/2009 | Soogoori | 714/786 |
| 2005/0278603 A1 * | 12/2005 | Berens et al. | 714/755 |
| 2006/0010362 A1 * | 1/2006 | Kwak | 714/755 |
| 2007/0110053 A1 * | 5/2007 | Soni et al. | 370/389 |
| 2009/0158130 A1 | 6/2009 | Cheun et al. | |
| 2009/0296798 A1 * | 12/2009 | Banna et al. | 375/229 |
| 2009/0313522 A1 * | 12/2009 | Edmonston | 714/752 |

OTHER PUBLICATIONS

International Search Report and Written Opinion correlating to PCT/IB2009/053787 dated May 27, 2010.

* cited by examiner

*Primary Examiner* — Albert Decady
*Assistant Examiner* — Enamul M Kabir

(57) ABSTRACT

A method for turbo-encoding a block of data including: receiving data bits of the block of data; masking irrelevant data bits by a masking unit, wherein irrelevant data bits are data bits that regardless of their value do not affect a final state of an interleaved convolutional encoder of a turbo encoder; calculating a last state of the interleaved convolutional encoder based on relevant data bits provided by the masking unit; wherein the calculating of the last state of the interleaved convolutional encoder is initialized before receiving the entire block of data; finding an initial state of the interleaved convolutional encoder based on the last state of the interleaved convolutional encoder; wherein the initial state of the interleaved convolutional encoder equals a final state of the interleaved convolutional encoder; initializing the interleaved convolutional encoder to the initial state; and turbo-encoding the interleaved data bits by the interleaved convolutional encoder.

20 Claims, 8 Drawing Sheets

| | S0 | | | | | | S1 | | | | | | S2 | | | | | |
|---|---|---|---|---|---|---|---|---|---|---|---|---|---|---|---|---|---|---|
| | 0 | 1 | 2 | 3 | 4 | 5 | 0 | 1 | 2 | 3 | 4 | 5 | 0 | 1 | 2 | 3 | 4 | 5 |
| 0 | 0 | 0 | 1 | 1 | 1 | 1 | 0 | 1 | 0 | 0 | 1 | 1 | 1 | 1 | 0 | 1 | 0 | 1 |
| 1 | 1 | 0 | 1 | 0 | 0 | 1 | 1 | 1 | 0 | 1 | 0 | 0 | 0 | 1 | 1 | 1 | 1 | 0 |
| 2 | 1 | 0 | 1 | 0 | 0 | 1 | 0 | 1 | 1 | 0 | 1 | 0 | 1 | 0 | 1 | 1 | 0 | 0 |
| 3 | 1 | 0 | 1 | 1 | 0 | 1 | 1 | 0 | 0 | 1 | 1 | 1 | 1 | 0 | 1 | 0 | 0 | 1 |
| 4 | 0 | 1 | 1 | 0 | 1 | 0 | 1 | 0 | 0 | 1 | 0 | 1 | 0 | 1 | 0 | 1 | 1 | 1 |
| 5 | 0 | 1 | 0 | 1 | 1 | 1 | 1 | 1 | 0 | 0 | 0 | 1 | 1 | 0 | 1 | 1 | 0 | 1 |
| 6 | 0 | 1 | 0 | 0 | 1 | 1 | 1 | 0 | 1 | 0 | 1 | 0 | 1 | 1 | 0 | 1 | 0 | 0 |
| 7 | 0 | 1 | 1 | 1 | 0 | 1 | 0 | 0 | 1 | 1 | 0 | 1 | 0 | 1 | 0 | 1 | 1 | 1 |
| 8 | 1 | 0 | 0 | 1 | 1 | 0 | 1 | 0 | 1 | 0 | 1 | 1 | 1 | 1 | 0 | 0 | 0 | 0 |
| 9 | 1 | 1 | 0 | 1 | 0 | 1 | 0 | 1 | 1 | 0 | 1 | 0 | 0 | 1 | 0 | 0 | 1 | 0 |
| 10 | 1 | 1 | 0 | 1 | 0 | 1 | 0 | 1 | 1 | 0 | 0 | 1 | 0 | 0 | 1 | 1 | 0 |
| 11 | 1 | 0 | 0 | 1 | 0 | 1 | 0 | 1 | 0 | 0 | 1 | 1 | 1 | 0 | 1 | 0 |
| 12 | 0 | 1 | 1 | 1 | 0 | 1 | 0 | 0 | 0 | 1 | 1 | 1 | 1 | 0 | 1 | 0 | 0 | 1 |
| 13 | 1 | 1 | 0 | 0 | 1 | 1 | 1 | 0 | 1 | 0 | 0 | 0 | 1 | 1 | 1 | 0 | 1 |
| 14 | 1 | 0 | 1 | 0 | 1 | 1 | 1 | 1 | 1 | 0 | 0 | 0 | 0 | 1 | 1 | 0 | 1 |
| 15 | 0 | 0 | 1 | 1 | 0 | 1 | 0 | 1 | 0 | 1 | 1 | 1 | 1 | 0 | 0 | 0 | 1 |
| 16 | 0 | 1 | 0 | 1 | 1 | 1 | 1 | 1 | 0 | 0 | 1 | 0 | 1 | 1 | 0 | 1 | 0 |
| 17 | 1 | 1 | 0 | 1 | 0 | 0 | 0 | 0 | 1 | 0 | 1 | 0 | 1 | 0 | 1 | 1 | 1 | 1 |
| 18 | 1 | 1 | 1 | 1 | 0 | 0 | 0 | 0 | 1 | 1 | 0 | 1 | 0 | 1 | 0 | 1 | 1 | 1 |
| 19 | 0 | 1 | 0 | 1 | 1 | 1 | 1 | 1 | 0 | 0 | 0 | 1 | 0 | 1 | 1 | 0 | 1 | 0 |
| 20 | 0 | 0 | 1 | 1 | 1 | 0 | 0 | 1 | 0 | 0 | 1 | 1 | 1 | 1 | 0 | 1 | 0 | 0 |

| | | 21 | 22 | 23 | 24 | 25 | 26 | 27 | 28 | 29 | 30 | 31 | 32 | 33 | 34 | 35 | 36 | 37 | 38 |
|---|---|---|---|---|---|---|---|---|---|---|---|---|---|---|---|---|---|---|---|
| S0 | 0 | 1 | 1 | 1 | 1 | 0 | 0 | 1 | 1 | 1 | 1 | 1 | 1 | 0 | 0 | 1 | 0 | 1 | 1 |
| | 1 | 0 | 0 | 0 | 1 | 1 | 1 | 0 | 0 | 1 | 1 | 0 | 0 | 1 | 1 | 0 | 1 | 1 | 1 |
| | 2 | 1 | 1 | 1 | 0 | 1 | 1 | 0 | 0 | 0 | 0 | 0 | 0 | 1 | 1 | 1 | 0 | 1 | 0 |
| | 3 | 0 | 0 | 1 | 0 | 0 | 0 | 0 | 1 | 1 | 1 | 1 | 0 | 1 | 1 | 0 | 1 | 1 | 0 |
| | 4 | 0 | 0 | 0 | 1 | 1 | 1 | 1 | 0 | 1 | 1 | 1 | 0 | 0 | 0 | 0 | 1 | 0 | 0 |
| | 5 | 1 | 1 | 1 | 1 | 1 | 1 | 1 | 1 | 0 | 0 | 0 | 1 | 1 | 1 | 1 | 1 | 0 | 0 |
| S1 | 0 | 1 | 1 | 1 | 1 | 1 | 1 | 1 | 1 | 1 | 1 | 0 | 1 | 1 | 0 | 1 | 1 | 0 | 0 |
| | 1 | 1 | 0 | 0 | 0 | 0 | 1 | 0 | 0 | 1 | 0 | 1 | 1 | 0 | 0 | 1 | 1 | 0 | 1 |
| | 2 | 0 | 1 | 1 | 1 | 1 | 1 | 1 | 1 | 1 | 1 | 0 | 1 | 1 | 1 | 0 | 0 | 1 | 0 |
| | 3 | 1 | 1 | 1 | 0 | 0 | 1 | 0 | 0 | 0 | 0 | 0 | 0 | 1 | 1 | 0 | 0 | 0 | 1 |
| | 4 | 1 | 1 | 1 | 1 | 1 | 0 | 1 | 1 | 1 | 0 | 1 | 1 | 0 | 0 | 1 | 1 | 1 | 0 |
| | 5 | 0 | 0 | 0 | 0 | 0 | 0 | 0 | 1 | 0 | 0 | 1 | 0 | 0 | 1 | 0 | 1 | 0 | 1 |
| S2 | 0 | 0 | 1 | 1 | 1 | 0 | 0 | 1 | 1 | 0 | 0 | 1 | 1 | 1 | 0 | 0 | 1 | 1 | 0 |
| | 1 | 0 | 0 | 0 | 1 | 0 | 0 | 1 | 1 | 0 | 0 | 1 | 1 | 0 | 1 | 0 | 1 | 0 | 1 |
| | 2 | 1 | 1 | 1 | 1 | 0 | 0 | 0 | 0 | 1 | 1 | 1 | 1 | 1 | 0 | 1 | 1 | 1 | 0 |
| | 3 | 1 | 1 | 0 | 0 | 1 | 1 | 1 | 0 | 0 | 0 | 0 | 1 | 0 | 0 | 1 | 0 | 0 | 1 |
| | 4 | 1 | 1 | 0 | 1 | 1 | 1 | 0 | 0 | 1 | 1 | 1 | 1 | 0 | 0 | 1 | 1 | 1 | 1 |
| | 5 | 0 | 0 | 0 | 1 | 1 | 1 | 1 | 0 | 0 | 0 | 0 | 1 | 1 | 1 | 0 | 0 | 1 | 1 |

|    |   | 39 | 40 | 41 | 42 | 43 | 44 | 45 | 46 | 47 | 48 | 49 | 50 | 51 | 52 | 53 | 54 | 55 |
|----|---|----|----|----|----|----|----|----|----|----|----|----|----|----|----|----|----|----|
| S0 | 0 | 0  | 1  | 0  | 0  | 1  | 1  | 0  | 0  | 1  | 1  | 1  | 1  | 1  | 1  | 0  | 0  | 1  |
|    | 1 | 1  | 1  | 0  | 0  | 1  | 1  | 1  | 1  | 0  | 1  | 0  | 0  | 1  | 0  | 1  | 1  | 0  |
|    | 2 | 0  | 0  | 1  | 1  | 0  | 0  | 1  | 1  | 0  | 0  | 1  | 0  | 1  | 1  | 1  | 1  | 1  |
|    | 3 | 0  | 0  | 1  | 1  | 1  | 0  | 0  | 0  | 0  | 1  | 1  | 1  | 0  | 0  | 1  | 1  | 0  |
|    | 4 | 1  | 0  | 0  | 0  | 0  | 1  | 1  | 1  | 1  | 0  | 0  | 1  | 0  | 0  | 0  | 0  | 0  |
|    | 5 | 1  | 1  | 1  | 1  | 1  | 1  | 0  | 0  | 1  | 0  | 1  | 0  | 0  | 1  | 0  | 1  | 1  |
| S1 | 0 | 1  | 0  | 0  | 0  | 0  | 1  | 1  | 1  | 1  | 0  | 0  | 1  | 1  | 1  | 1  | 1  | 1  |
|    | 1 | 1  | 1  | 1  | 1  | 1  | 1  | 0  | 0  | 1  | 0  | 0  | 0  | 1  | 1  | 0  | 0  | 1  |
|    | 2 | 0  | 1  | 0  | 0  | 1  | 0  | 1  | 1  | 0  | 1  | 0  | 1  | 0  | 0  | 0  | 0  | 1  |
|    | 3 | 1  | 0  | 1  | 0  | 1  | 1  | 1  | 1  | 0  | 1  | 0  | 0  | 1  | 1  | 1  | 1  | 0  |
|    | 4 | 0  | 1  | 1  | 1  | 1  | 0  | 1  | 1  | 0  | 0  | 1  | 1  | 0  | 0  | 0  | 1  | 1  |
|    | 5 | 1  | 0  | 1  | 1  | 0  | 0  | 0  | 1  | 0  | 1  | 1  | 1  | 1  | 0  | 1  | 1  | 0  |
| S2 | 0 | 0  | 1  | 1  | 1  | 1  | 0  | 1  | 0  | 0  | 0  | 1  | 1  | 0  | 0  | 0  | 1  | 0  |
|    | 1 | 1  | 0  | 0  | 1  | 0  | 1  | 1  | 1  | 0  | 1  | 0  | 1  | 1  | 1  | 1  | 0  | 0  |
|    | 2 | 1  | 0  | 0  | 0  | 0  | 1  | 0  | 0  | 0  | 0  | 1  | 1  | 1  | 1  | 0  | 1  | 0  |
|    | 3 | 1  | 1  | 1  | 1  | 1  | 1  | 0  | 0  | 1  | 1  | 0  | 1  | 1  | 1  | 0  | 0  | 1  |
|    | 4 | 1  | 1  | 0  | 0  | 1  | 0  | 1  | 1  | 0  | 1  | 0  | 0  | 1  | 1  | 1  | 0  | 1  |
|    | 5 | 0  | 0  | 1  | 1  | 0  | 1  | 1  | 1  | 1  | 1  | 0  | 0  | 1  | 1  | 1  | 1  | 0  |

|  | S0 |  |  |  |  |  | S1 |  |  |  |  |  | S2 |  |  |  |  |  |
|---|---|---|---|---|---|---|---|---|---|---|---|---|---|---|---|---|---|---|
|  | 0 | 1 | 2 | 3 | 4 | 5 | 0 | 1 | 2 | 3 | 4 | 5 | 0 | 1 | 2 | 3 | 4 | 5 |
| 56 | 1 | 1 | 1 | 0 | 1 | 0 | 0 | 0 | 1 | 1 | 1 | 0 | 0 | 1 | 0 | 0 | 1 | 1 |
| 57 | 1 | 0 | 0 | 1 | 1 | 1 | 0 | 1 | 0 | 0 | 1 | 1 | 1 | 0 | 1 | 0 | 1 | 0 |
| 58 | 0 | 0 | 0 | 1 | 1 | 1 | 1 | 0 | 1 | 0 | 0 | 1 | 0 | 1 | 1 | 0 | 1 | 0 |
| 59 | 0 | 1 | 1 | 0 | 1 | 0 | 1 | 0 | 1 | 1 | 0 | 1 | 1 | 0 | 0 | 1 | 1 | 1 |
| 60 | 1 | 1 | 0 | 1 | 0 | 1 | 0 | 1 | 1 | 1 | 0 | 1 | 0 | 0 | 1 | 1 | 1 | 0 |
| 61 | 0 | 0 | 1 | 1 | 0 | 1 | 0 | 1 | 0 | 0 | 1 | 1 | 1 | 1 | 0 | 1 | 0 | 1 |
| 62 | 0 | 0 | 1 | 1 | 1 | 1 | 0 | 1 | 0 | 0 | 1 | 1 | 1 | 1 | 0 | 1 | 0 | 1 |
| 63 | 1 | 1 | 0 | 1 | 0 | 1 | 0 | 1 | 1 | 1 | 0 | 0 | 1 | 0 | 0 | 1 | 1 | 0 |

503

DEVICE AND METHOD FOR TURBO-ENCODING A BLOCK OF DATA

FIELD OF THE INVENTION

This disclosure relates generally to devices comprising a turbo-encoder, to methods for turbo-encoding and especially to devices and methods that may facilitate tail biting turbo-encoding of blocks of data.

BACKGROUND OF THE INVENTION

Wireless communication systems are widely deployed to provide various types of communications such as voice and data. Wireless communication systems wirelessly transmit voice and data over Radio Frequency (RF) carrier waves. To overcome data corruption that can occur during RF transmission, the data, before being RF transmitted is encoded. One common coding technique is knows as turbo-encoding.

A turbo encoder typically comprises a pair of convolutional encoders, one of which receives data bits (i.e. systematic bits) while the other (referred to as interleaved convolutional encoder) receives interleaved data bits. The data bits are shuffled (interleaved) in accordance with a specified interleaving scheme.

The turbo encoder outputs a data bit, a parity bit and an interleaved parity bit per each data bit it receives. The parity bit is outputted from the non-interleaved convolutional encoder while the interleaved parity bit is outputted from the interleaved convolutional encoder. The bits that are outputted from the turbo encoder are also known as encoded data bits.

Turbo encoders usually encode one block of data after the other. One known method of turbo-encoding is called "tail biting". Tail biting means that an initial state of the turbo encoder (the state of the turbo encoder before encoding a block of data) equals the final state of the encoder (the state of the turbo encoder after encoding the entire block of data).

The content of each block of data affects the state of the turbo encoder and not all possible initial states of a turbo encoder facilitate tail biting. There is a need to calculate, before the encoding process starts, a state (so called last state) of the encoder and from that last state to find an initial state of the turbo encoder that will facilitate tail biting.

The state of the turbo encoder comprises a state of an interleaved convolutional encoder of the turbo encoder. The calculation of the last state of the interleaved convolutional encoder does not start until after the entire block of data is received and interleaved—as the interleaver first receives the entire block of data and only then interleaves the block of data to provide interleaved data bits.

SUMMARY OF THE PRESENT INVENTION

The present invention provides a method and a device as described in the accompanying claims. Specific embodiments of the invention are set forth in the dependent claims. These and other aspects of the invention will be apparent from and elucidated with reference to the embodiments described hereinafter.

BRIEF DESCRIPTION OF THE DRAWINGS

Further details, aspects, and embodiments of the invention will be described, by way of example only, with reference to the drawings.

FIGS. 5-8 illustrate an example of an embodiment of four different portions of three masks.

DETAILED DESCRIPTION OF THE DRAWINGS

Because the device implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

It has been found that a turbo-encoding of a block of data can be speeded up by starting to calculate the last state of an interleaved convolutional encoder of a turbo encoder before the entire block of data is received by the turbo encoder.

Figure 1:
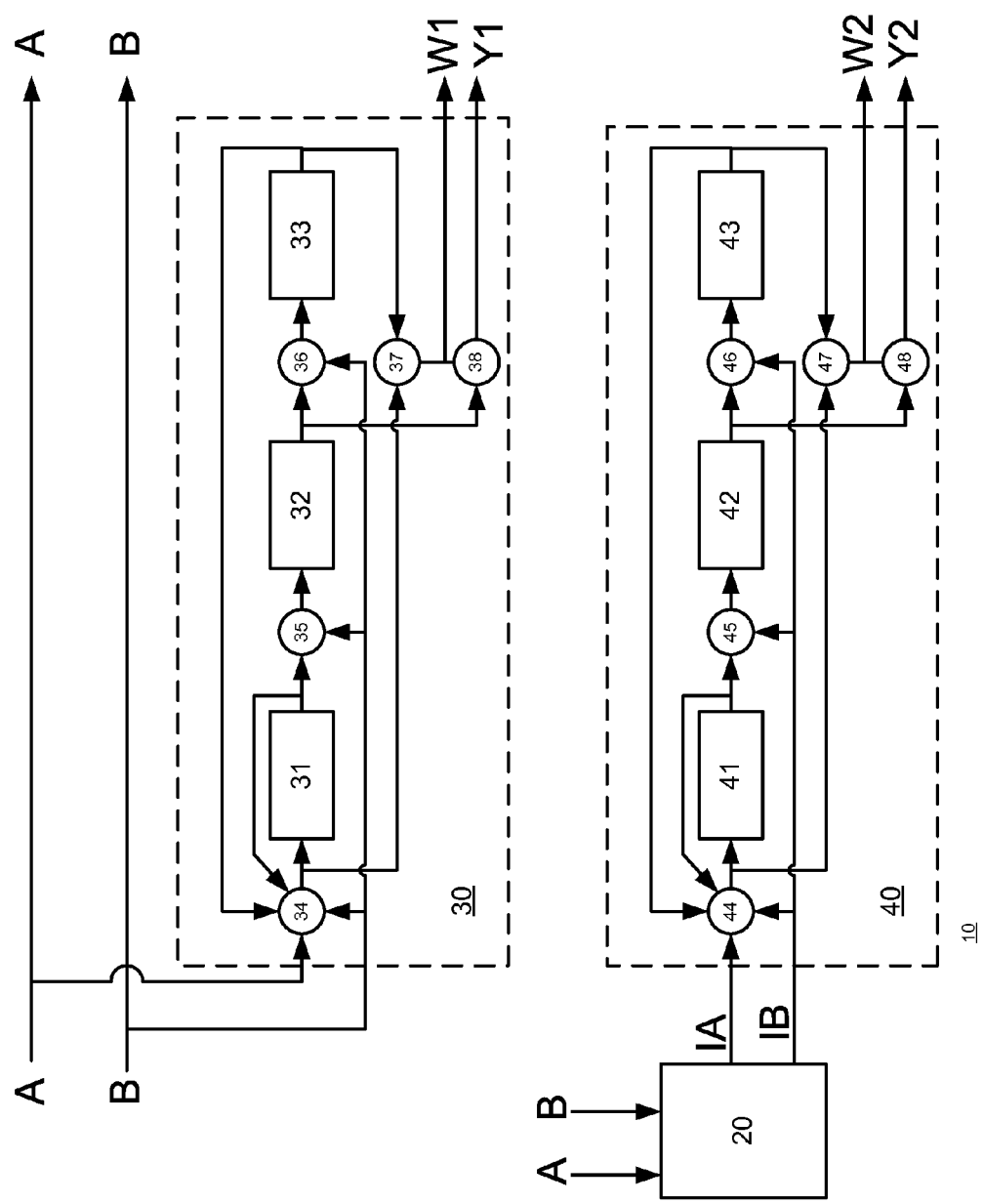
FIG. 1 schematically shows a prior art convolutional encoder, interleaved convolutional encoder and an interleaver.

FIG. 1 schematically shows prior art interleaver 20, non-interleaved convolutional encoder 30 and interleaved convolutional encoder 40.

Non-interleaved convolutional encoder 30 comprises three taps. Each tap comprises a storage element and a XOR gate. A first tap of non-interleaved convolutional encoder 30 comprises first storage element 31 ("S0") and first XOR gate 34. A second tap of non-interleaved convolutional encoder 30 comprises second storage element 32 ("S1") and second XOR gate 35. A third tap of non-interleaved convolutional encoder 30 comprises third storage element 33 ("S2") and third XOR gate 36.

The output of first XOR gate 34 is connected to an input of first storage element 31. The output of second XOR gate 35 is connected to an input of second storage element 32. The output of third XOR gate 36 is connected to an input of third storage element 33.

In FIG. 1, first XOR gate 34 is shown to receive as inputs a first data bit (A), a second data bit (B), and feedback signals such as an output signal of first storage element 31 and an output signal of third storage element 33. First XOR gate 34 applies an XOR operation on these inputs and provides a value that is stored in first storage element 31. This value can be referred to as a next value (or state of) of first storage element 31. The next value replaces the current value of first storage element 31.

In FIG. 1, second XOR gate 35 is shown to receive as inputs the second data bit (B) and an output signal of first storage element 31. Second XOR gate 35 applies an XOR operation on these inputs and provides a value that is stored in second storage element 32. This value can be referred to as a next value (or state of) of second storage element 32. The next value replaces the current value of second storage element 32.

In FIG. 1, third XOR gate 36 is shown to receive as inputs a third data bit (B) and an output signal of second storage element 32. Third XOR gate 36 applies an XOR operation on these inputs and provides a value that is stored in third storage element 33. This value can be referred to as a next value (or state of) of third storage element 33. The next value replaces the current value of third storage element 33.

Non-interleaved convolutional encoder 30 also comprises first adder 37 and second adder 38. First adder 37 adds the output signals from first XOR gate 34 and third storage element 33 to provide first parity bit W1. Second adder 38 (which can be a XOR gate) adds the output signals from first adder 37 (which can be a XOR gate) and second storage element 32 to provide second parity bit Y1.

Interleaved convolutional encoder 40 comprises three taps, wherein each tap comprises a storage element and a XOR gate.

A first tap of interleaved convolutional encoder 40 comprises fourth storage element 41 ("S4") and fourth XOR gate 44. A second tap of interleaved convolutional encoder 40 comprises fifth storage element 42 ("S5") and fifth XOR gate 45. A third tap of interleaved convolutional encoder 40 comprises sixth storage element 43 ("S6") and sixth XOR gate 46.

The output of fourth XOR gate 44 is connected to an input of fourth storage element 41. The output of fifth XOR gate 45 is connected to an input of fifth storage element 42. The output of sixth XOR gate 46 is connected to an input of sixth storage element 43.

In FIG. 1, fourth XOR gate 44 is shown to receive as inputs a first interleaved data bit (IA), a second interleaved data bit (IB), and feedback signals such as an output signal of fourth storage element 41 and an output signal of sixth storage element 43. Fourth XOR gate 44 applies an XOR operation on these inputs and provides a value that is stored in fourth storage element 41. This value can be referred to as a next value (or state of) of fourth storage element 41. The next value replaces the current value of fourth storage element 34.

Fifth XOR gate 45 is shown to receive as inputs second interleaved data bit (IB) and an output signal of fourth storage element 41. Fifth XOR gate 45 applies an XOR operation on these inputs and provides a value that is stored in fifth storage element 42. This value can be referred to as a next value (or state of) of fifth storage element 42. The next value replaces the current value of fifth storage element 34.

Sixth XOR gate 46 is shown to receive as inputs second interleaved data bit (IB) and an output signal of fifth storage element 42. Sixth XOR gate 46 applies an XOR operation on these inputs and provides a value that is stored in sixth storage element 43. This value can be referred to as a current value (or state of) of sixth storage element 43.

Interleaved convolutional encoder 40 also comprises third adder 47 and fourth adder 48. Third adder 47 adds the output signals from fourth XOR gate 44 and sixth storage element 43 to provide first interleaved parity bit W2. Fourth adder 48 adds the output signals from third adder 47 and fifth storage element 42 to provide second interleaved parity bit Y2.

Non-interleaved convolutional encoder 30 encodes data bits of a block of data in an iterative manner—a current state of each of its storage elements (31, 32 and 33) depends upon a previous state of a storage element and a data bit.

Interleaved convolutional encoder 40 encodes data bits of a block of data in an iterative manner—a current state of each of its storage elements (41, 42 and 43) depends upon a previous state of a storage element and a data bit.

Figure 2:
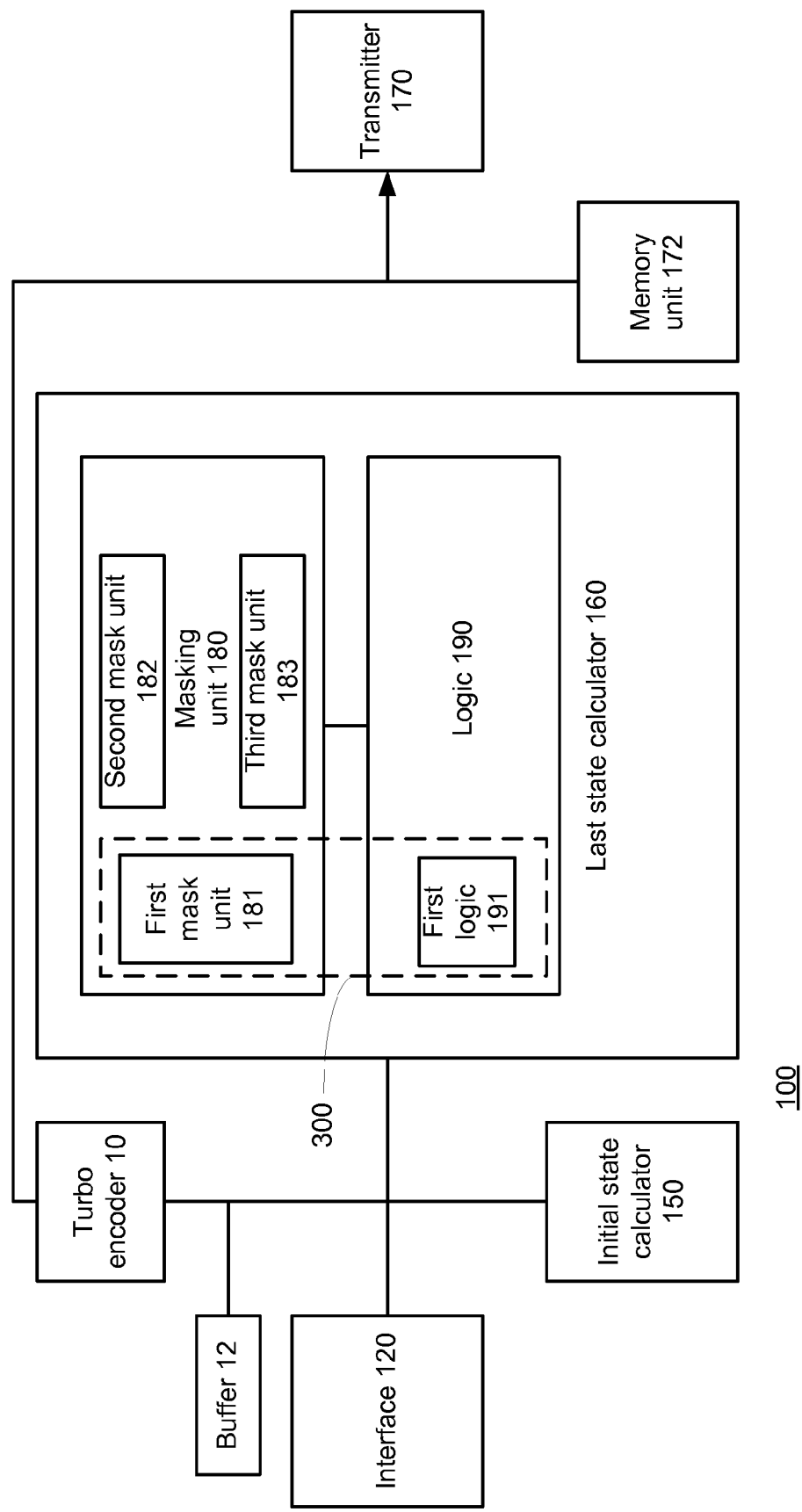
FIG. 2 schematically shows an example of an embodiment of a device.

FIG. 2 schematically shows an example of an embodiment of device 100 having turbo-encoding functionality FIG. 2 illustrates device 100 as including interface 120, turbo encoder 10, initial state calculator 150, last state calculator 160, memory unit 172 and transmitter 170. Turbo encoder 10 is connected to initial state calculator 150, last state calculator 160, memory unit 172 and transmitter 170.

Turbo encoder 10 may include an interleaver (such as interleaver 20 of FIG. 1), convolutional encoder (such as the convolutional encoder 30 of FIG. 1) and interleaved convolutional encoder (such as the interleaved convolutional encoder 40 of FIG. 1).

Memory unit 172 may store encoded data bits from turbo encoder 10 and transmitter 170 may transmit encoded data bits but may transmit symbols representative of the encoded data bits.

At interface 120 data bits can be received. The interface 120 may for example receive a stream of data bits of a certain block of data and then receive a stream of data bits of another block of data. Interface 120 provides data bits of each block of data to turbo encoder 10—one pair of data bits at a time.

The interleaver of the turbo encoder is active during the turbo-encoding process that follows the initialization of turbo encoder 10 to its initial state. The interleaver of turbo encoder 10 waits until the entire block of data is buffered in an internal memory (such as buffer 12 of FIG. 2), and reads the data bits in interleaved order—two interleaved data bits at a time. It is noted that turbo encoder 10 can receive more than two data bits at a time or can receive only a single data bit at a time.

Last state calculator 160 can start calculating the last state of turbo encoder 10 before the interleaver completes (or even starts) the interleaving of data bits. Thus, the encoding process can be accelerated by performing multiple operations in an at least partially overlapping manner. Instead of interleaving data bits to provide interleaved data bits and then calculating the last state of the interleaved convolutional encoder of turbo encoder 10 based upon the interleaved data bits, last state calculator 160 performs its calculation based upon data bits that are not interleaved.

Last state calculator 160 can start calculating the last state of turbo encoder 10 before the entire block of data is received by turbo encoder 10. Last state calculator 160 can for instance start the calculation of the last state of interleaved convolutional encoder 40 immediately after it starts receiving data bits that are required for the calculation of that last state.

A calculation of the last state of a certain block of data (the n'th block of data) can be executed in parallel to a turbo-encoding of a previous block of data (the (n−1)'th block of data), index n being a positing integer.

When data bits of a block of data are received last state calculator 160 calculates the last state of interleaved convolutional encoder 40. The calculation can include (or can be preceded by) masking irrelevant data bits—data bits that do not affect the last state of interleaved convolutional encoder 40.

In the shown example, last state calculator 160 comprises masking unit 180 and logic unit 190. Masking unit 180 outputs relevant data bits to logic unit 190. Logic unit 190 processes the relevant data bits by performing XOR operations between them and the content of a storage element (denoted 330 in FIG. 3).

FIG. 2 illustrates last state calculator 160 as including three mask units 181, 182 and 183. However, it can include a different number, e.g. example six, mask units (not shown), such as to calculate the state of each tap of both the interleaved convolutional encoder 30 and the non-interleaved convolutional encoder 40.

Assuming, for example, that interface 120 provides data bits, and turbo encoder 10 buffers the data bits before it starts encoding with interleaved convolution encoder 40. In such a case, last state calculator 160 may be active while interface 120 writes data bits into this buffer 12 such that when the entire data block is ready in buffer 12 the last state of turbo encoder 20 is calculated too. It is noted that buffer 12 may be a double buffer that can be used for pipe-lining this process. Accordingly, buffer 12 can receive data bits while initial state calculator 150 calculates the initial state of this data block. In addition, data bits can be read from buffer 12 and be sent to non-interleaved convolutional encoder 30. In FIG. 2, buffer 12 is illustrated as being connected to turbo encoder 10. However, it can be included within turbo encoder 10.

The masking is executed by masking unit 180. Masking unit 180 may include one or more masks. These one or more masks can be calculated before the encoding process of blocks of data starts and can be, for example, stored in a memory unit or implemented by a gate array.

At least one mask is calculated based on an interleaving function that is applied (during the turbo-encoding) by interleaver 20. The interleaving function allows a selection of data bits that correspond to interleaved data bits that may affect the last state of interleaved convolutional encoder 40.

A mask can be provided per each tap of interleaved convolutional encoder 40, per each size of block of data, and per each segment of a block of data, or a combination thereof.

A mask can be defined by representing the last state of each storage element of interleaved convolutional encoder 40 as a function of a predefined start state of the storage element and one or more data bits. It is noted that a mask can also be defined for each predefined state of non-interleaved convolutional encoder 40.

In relation to fourth storage element 41—its last state can be derived from the initial state of the fourth to sixth storage elements 41-43, the structure of the convolution encoder, the interleaving function and the data stream (i.e. the interleaved data stream). These factors are taken into account while calculating the masks which are going to be used on the non-interleaved data stream The following set of equations represents an example of various states of fourth storage element 41 as a function of interleaved data bits. It is noted that starting from S0(2) the equation does not include feedbacks from storage element 43. This non-iterative (without feedback) calculation uses a calculation of all three storage elements S0, S1, S2 step by step.

$S0(1) = S0(0)\hat{}S2(0)\hat{}IA(1)\hat{}IB(1)$.

$S0(2) = S0(1)\hat{}S2(1)\hat{}IA(2)\hat{}IB(2) = S0(0)\hat{}S1(0)\hat{}IB(1)\hat{}IA(1)\hat{}IB(1)\ \hat{}IA(2)\hat{}IB(2)$.

$S0(3) = S0(2)\hat{}S2(2)\hat{}IA(3)\hat{}IB(3) = S0(0)\hat{}IA(1)\hat{} \ldots \hat{}IB(1)\hat{}IA(2)\hat{}IB(2)\hat{}IA(3)\hat{}I(3)$.

$S0(N/2) = S0(N/2-1)\hat{}S2(N/2-1)\hat{}IA(N/2)\hat{}IB(N/2) = S0(N/2-2)\hat{}IA(N/2-1)\hat{}IB(N/2-1)\hat{}IA(N/2)\hat{}IB(N/2) = S0(N/2-3)\hat{}IA(N/2-2)\hat{}IB(N/2-2)\hat{}IA(N/2-1)\hat{}IB(N/2-1)\hat{}IA(N/2)\hat{}IB(N/2)$ = bitwise XOR between relevant initial states and relevant data bits.

Wherein "^" represents a XOR operation, S0(0) is the predefined start state of fourth storage element 41; S0(j) is the state of fourth storage element 41 after j iterations (wherein j ranges between one and N/2); IA(j) and IB(j) are the j'th pair of interleaved data bits of an N bit long interleaved block of data, S0(N/2) is the last state of first storage element 41. In this calculation, the relevant initial state may be an initial state of any of the storage elements of the interleaved convolutional encoder that may affect the last state of first storage element.

In order to calculate the last state of fourth storage element 41 these equations (or at least the equation that represents the last state of fourth storage element) can be re-written to reflect a relationship between these states and non-interleaved data bits. In addition, those data bits that are XORed with themselves do not affect the last state of fourth storage element 41 and can be omitted.

The following set of equations represent an example of various states of fifth storage element 42 as a function of interleaved data bits:

$S1(1) = S0(0)\hat{}IB(1);$ $S1(2) = S0(1)\hat{}IB(2) = S0(0)\hat{}IB(1)\hat{}IB(2).$ $S1(3) = S1(2)\hat{}IB(3) = S0(0)\hat{}IB(1)\hat{}IB(2)\hat{}IB(3).$ $S1(N/2) = S1(N/2-1)\hat{}IB(N/2) = S1(N/2-2)\hat{}IB(N/2-1)\hat{}A(N/2)\hat{}IB(N/2) = S0(N/2-3)\hat{}IA(N/2-2)\hat{}IB(N/2-2)\hat{}IA(N/2-1)\hat{}IB(N/2-1)\hat{}IA(N/2)\hat{}IB(N/2) \ldots = S0(0)\hat{}$ relevant data bits.

In order to calculate the last state of fifth storage element 42 these equations (or at least the equation that represents the last state of fifth storage element) can be re-written to reflect a relationship between these states and non-interleaved data bits. In addition, those data bits that are XORed with themselves do not affect the last state of fifth storage element 42 and can be omitted.

The following set of equations represent an example of various states of sixth storage element 43 as a function of interleaved data bits:

$S2(1) = S1(0)\hat{}IB(1);$ $S2(2) = S1(1)\hat{}IB(2) = S0(0)\hat{}IB(1)\hat{}IB(2).$ $S2(3) = S1(2)\hat{}IB(3) = S0(1)\hat{}IB(2)\hat{}IB(3) = S0(0)\hat{}S2(0)\hat{}IA(1)\hat{}IB(1)\hat{}IB(2)\hat{}IB(3)$ $S2(N/2) = S1(N/2-1)\hat{}IB(N/2) = S0(N/2-2)\hat{}IB(N/2-1)\hat{}IA(N/2)\hat{}IB(N/2) = S0(N/2-3)\hat{}IA(N/2-2)\hat{}IB(N/2-2)\hat{}IA(N/2-1)\hat{}IB(N/2-1)\hat{}IA(N/2)\hat{}IB(N/2) \ldots = S0(0)$ A relevant data bits.

In order to calculate the last state of sixth storage element 43 these equations (or at least the equation that represents the last state of sixth storage element) is re-written to reflect a relationship between these states and non-interleaved data bits.

In addition, those data bits (or the relevant initial state of the encoder in the first pass S0(0), S1(0), S2(0)) that are XORed with themselves do not affect the last state of sixth storage element 43.

The following example illustrates the calculation of the last state of interleaved convolutional encoder 40 that performs a WiMax compliant tail biting turbo-encoding.

During the turbo-encoding process interleaver 20 performs a dual state interleaving process.

During a first interleaving stage interleaver 20 switches the location of bits of each second pair of data bits. Interleaver 20 receives a sequence U0 of input bits: U0=[(A0, B0), (A1, B1), (A2, B2), (A3, B3), . . . , (AN−1, BN−1)]. It switches the data bits of each second pair of data bits to give sequence U1. U1=[(A0, B0), (B1, A1), (A2, B2), (B3, A3), . . . , (BN−1, AN−1)]. The bits of the even pairs of bits were switched. U1 can also be written as U1=[U1(0), U1(1), U1(2), U1(3), . . . , U1(N−1)].

During a second interleaving stage interleaver 20 applies a function P(j). Function P(j) provides the address of a couple of pair of data bits of sequence U1 that shall be mapped onto the address j of the interleaved sequence (i.e., U2(j)=U1(P(j))). Index j indicates the order of bits of U2−U2(j) is the j'th interleaved data bit of U2.

P(j) has the following format: (i) apply a modulo four on index j to provide an intermediate result; (ii) if the intermediate result equals zero then U2(j)=U1([P0*j+1] mod N); (iii) if the intermediate result equals one then U2(j)=U1([P0*j+N/2+P1] mod N); (iv) if the intermediate result equals two then U2(j)=U1([P0*j+1+P2] mod N); (v) if the intermediate result equals three then U2(j)=U1([P0*j+N/2+P3] mod N).

In mathematical terms: U2=[u1(P(0)), u1(P(1)), u1(P(2)), u1(P(3)), ..., u1(P(N−1))]=[(BP(0), AP(0)), (AP(1), BP(1)), (BP(2), AP(2)), (AP(3), BP(3)), ..., (AP(N−1), BP(N−1))].

It is noted that typically coefficients P0, P1, P2, P3 will be determined in advance, for example by an encoding standard such as the turbo-encoding WiMax standard.

Assuming, for example, that a block of data comprises 384 bits. These data bits form 192 pairs of data bits denoted A0, B0 A1, B1 A2, B2 ... B191, A191.

The first interleaving stage provides U1. U1=A0, B0, B1, A1, A2, B2 ... B191, A191 which is equivalent to bits 0, 1, 3, 2, ... 383,382.

The second step interleaving provides U2. The following vector illustrates the relationship between the order of data bits of U2 and U0: 3, 2, 24, 25, 143, 142, 164, 165, 91, 90, 112, 113, 231, 230, 252, 253, 179, 178, 200, 201, 319, 318, 340, 341, 267, 266, 288, 289, 23, 22, 44, 45, 355, 354, 376, 377, 111, 110, 132, 133, 59, 58, 80, 81, 199, 198, 220, 221, 147, 146, 168, 169, 287, 286, 308, 309, 235, 234, 256, 257, 375, 374, 12, 13, 323, 322, 344, 345, 79, 78, 100, 101, 27, 26, 48, 49, 167, 166, 188, 189, 115, 114, 136, 137, 255, 254, 276, 277, 203, 202, 224, 225, 343, 342, 364, 365, 291, 290, 312, 313, 47, 46, 68, 69, 379, 378, 16, 17, 135, 134, 156, 157, 83, 82, 104, 105, 223, 222, 244, 245, 171, 170, 192, 193, 311, 310, 332, 333, 259, 258, 280, 281, 15, 14, 36, 37, 347, 346, 368, 369, 103, 102, 124, 125, 51, 50, 72, 73, 191, 190, 212, 213, 139, 138, 160, 161, 279, 278, 300, 301, 227, 226, 248, 249, 367, 366, 4, 5, 315, 314, 336, 337, 71, 70, 92, 93, 19, 18, 40, 41, 159, 158, 180, 181, 107, 106, 128, 129, 247, 246, 268, 269, 195, 194, 216, 217, 335, 334, 356, 357, 283, 282, 304, 305, 39, 38, 60, 61, 371, 370, 8, 9, 127, 126, 148, 149, 75, 74, 96, 97, 215, 214, 236, 237, 163, 162, 184, 185, 303, 302, 324, 325, 251, 250, 272, 273, 7, 6, 28, 29, 339, 338, 360, 361, 95, 94, 116, 117, 43, 42, 64, 65, 183, 182, 204, 205, 131, 130, 152, 153, 271, 270, 292, 293, 219, 218, 240, 241, 359, 358, 380, 381, 307, 306, 328, 329, 63, 62, 84, 85, 11, 10, 32, 33, 151, 150, 172, 173, 99, 98, 120, 121, 239, 238, 260, 261, 187, 186, 208, 209, 327, 326, 348, 349, 275, 274, 296, 297, 31, 30, 52, 53, 363, 362, 0, 1, 119, 118, 140, 141, 67, 66, 88, 89, 207, 206, 228, 229, 155, 154, 176, 177, 295, 294, 316, 317, 243, 242, 264, 265, 383, 382, 20, 21, 331, 330, 352, 353, 87, 86, 108, 109, 35, 34, 56, 57, 175, 174, 196, 197, 123, 122, 144, 145, 263, 262, 284, 285, 211, 210, 232, 233, 351, 350, 372, 373, 299, 298, 320, 321, 55, 54, 76, 77.

The following example illustrates a masking of irrelevant data bits by a sequence of six masks, each 64-bits long:
1. The first sixty-four bit long mask will mask the $1^{st}$-$64^{th}$ data bits except of relevant data bits of this group.
2. The second sixty-four bit long mask will mask the $65^{th}$-$128^{th}$ data bit except of relevant data bits of this group.
3. The third sixty-four bit long mask will mask the $129^{th}$-$192^{nd}$ data bits except of relevant data bits of this group.
4. The fourth sixty-four bit long mask will mask the $193^{rd}$-$256^{th}$ data bits except of relevant data bits of this group.
5. The fifth sixty-four bit long mask will mask the $257^{th}$-$320^{th}$ data bits except of relevant data bits of this group.
6. The sixth sixty-four bit long mask will mask the $321^{st}$-$384^{th}$ data bits except of relevant data bits of this group.

Data bits of a block of data may be masked by 64-bit long masks. In order to mask the entire block of data six different 64-bit long masks are applied on the data bits.

These masks can mask bits before the entire block of data arrives and even before data bits of higher order arrive—for example, a mask can mask the $24^{th}$ data bit, the $25^{th}$ data bit, the $90^{th}$ data bit and the $91^{st}$ data bit before receiving the $143^{rd}$ data bit.

FIGS. 5-8 illustrate four different portions of a table that comprises a first mask, a second mask and a third mask. The first mask is used to calculate the state of fourth storage element 44. The second mask is used to calculate the state of fifth storage element 45. The third mask is used to calculate the state of sixth storage element 46.

Each mask is 384-bits long and is represented by six 64-bit long mask segments. The mask segments are applied one after the other. The first six rows of the table (denoted S0) represent the six segments of the first mask. The seventh till twelfth rows of the table (denoted S1) represent the six segments of the second mask. The last six rows of the table (denoted S2) represent the six segments of the third mask.

For simplicity of explanation table 1 was spit to four portions whereas FIG. 5 comprises bits 0-20 of each mask segment, FIG. 6 comprises bits 21-38 of each mask segment, FIG. 7 comprises bits 39-55 of each segment and FIG. 8 comprises bits 56-63 of each segment.

Figure 3:
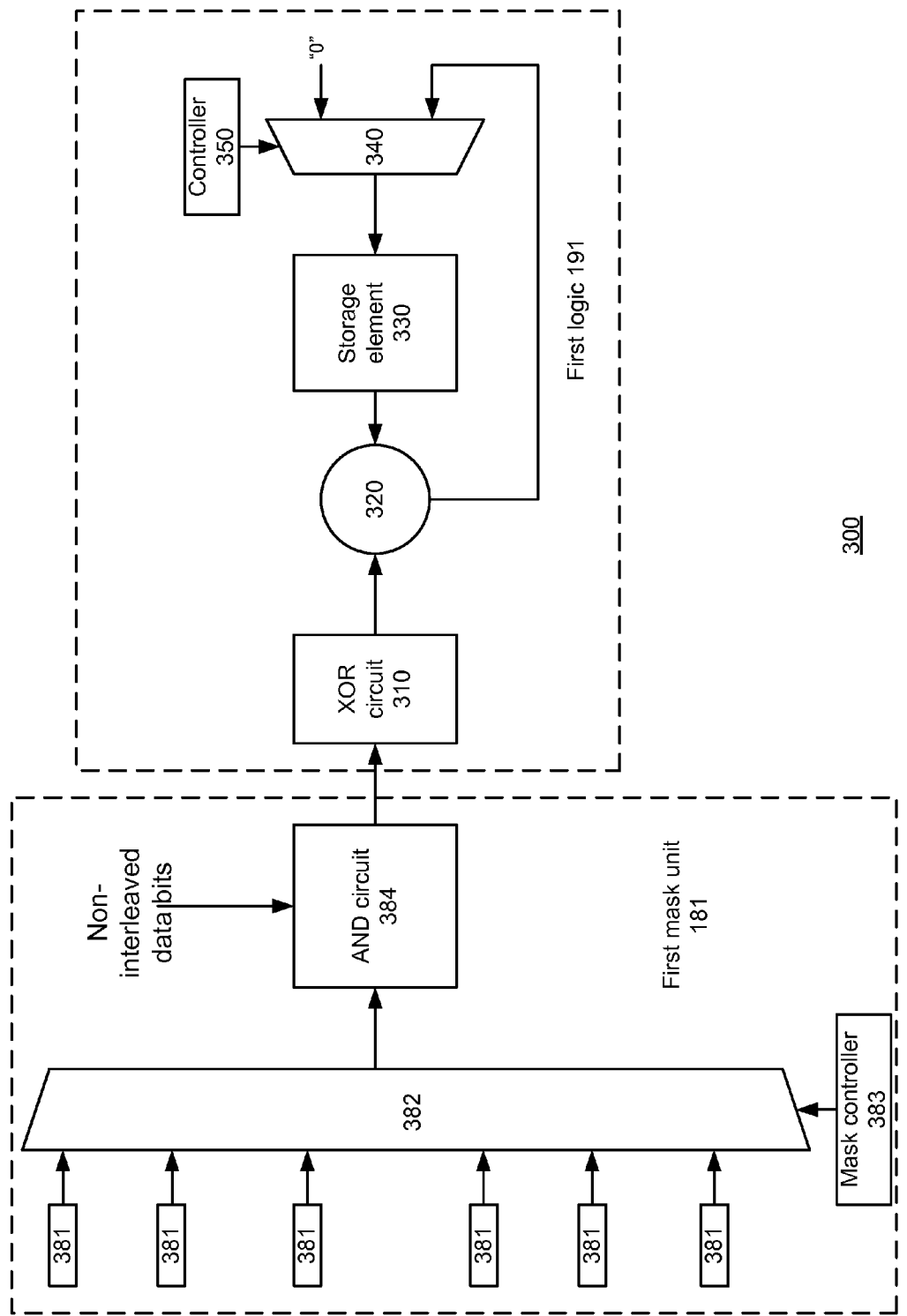
FIG. 3 schematically shows an example of an embodiment of a portion of a last state calculator.

FIG. 2 illustrates last state calculator 160 as including a portion 300 which comprises first mask unit 181 and first logic unit 191. Portion 300 calculates the last state of the first tap of interleaved convolutional encoder 40. FIG. 3 schematically shows an example of an embodiment of portion 300 of last state calculator 160. First logic unit 191 comprises XOR circuit 310, XOR gate 320, storage element 330, multiplexer 340 and controller 350.

The output of first mask unit 181 is connected to XOR circuit 310. The inputs of XOR gate 320 are connected to an output of XOR circuit 310 and an output of storage element 320. The output of XOR gate 320 is connected to a second input of multiplexer 340. A first input of multiplexer 340 receives a predefined start value such as '0' (if the initial state of the turbo encoder in the first iteration is '0'). The output of multiplexer 340 is connected to an input of storage element 320. Controller 350 sends a control signal to multiplexer 340 such as to select the first input during an initialization stage and otherwise select the second input of multiplexer 340.

First mask unit 181 comprises six masking elements denoted 381, mask multiplexer 382, mask controller 383, and AND circuit 384.

Six masking elements 381 store the six mask segments of the first mask and are connected to six inputs of mask multiplexer 382. The first masking element stores the first sixty four bits of the first mask, the second masking element stores the next sixty four bits of the first mask and so fourth. Each masking element may store a row of the table illustrated in FIGS. 5-8.

Mask controller 383 is connected to a control input of mask multiplexer 382. The output of mask multiplexer 382 is connected to AND circuit 384. AND circuit 384 also receives data bits. The output of AND circuit 384 is connected to an input of XOR circuit 310.

Mask controller 383 selects between the mask elements by sending control signals to mask multiplexer 382. Mask controller 383 can be a counter that follows the reception of data bits.

Mask multiplexer 382 outputs a sixty four bit mask segment (which is the value of the selected masking element) at a time and AND circuit 384 performs sixty four bitwise AND operations between sixty four data bits and the sixty four bits of the mask segment. The output of AND circuit 384 are relevant data bits.

The relevant data bits are provided to XOR circuit 310 that performs a bitwise XOR operation on the relevant data bits to provide a single bit which is referred to as a XOR intermediate result. The XOR intermediate result is fed to XOR gate 320.

During an initialization stage of portion 300 multiplexer 340 provides a predefined start value to storage element 330.

When processing the first sixty four data bits the XOR circuit 320 is fed by the predefined start value and by XOR intermediate results that are related to relevant data bits out the first sixty four data bits. The output of this XOR operation (of XOR gate 320) is referred to as preliminary result. The preliminary result is sent, via multiplexer 340 to storage element 330.

When processing each of the sixty fifth till the three hundred and eighty four data bits an old preliminary result and a current XOR intermediate result are fed to XOR circuit 320 that in turn generated a current preliminary result.

When all 384 bits of a block of data are processed by portion 300 the last state of the first tap of interleaved convolutional encoder 40 is outputted by XOR circuit 320.

It is noted that the length of masking elements can differ from sixty four. For example, the six masking elements 381, mask multiplexer 382 and mask controller 383 can be replaced by a single 384-bit long masking element.

Initial state calculator 150 finds a final state of the interleaved convolutional encoder based on the last state of the interleaved convolutional encoder. Initial state calculator 150 can be a look up table or can access a look up table that maps last states to initial states. The look up table is calculated in advance—before the encoding process starts.

Initial state calculator 150 initializes interleaved convolutional encoder 40 with the initial state. After being initialized—interleaved convolutional encoder 40 encodes the interleaved block of data and outputs interleaves parity bits.

Device 100 may also need to encode non-interleaved data bits. Device 100 can calculate the last state of non-interleaved convolutional encoder 30, find the initial state of non-interleaved convolutional encoder 30, initialize the non-interleaved convolutional encoder 30 with the initial state and encode the block of data. The calculation of the last state can apply prior art methods—for example iteratively calculating the last state.

Alternatively, the calculation of the last state of non-interleaved convolutional encoder 30 can be similar to the calculation of the last state of interleaved convolutional encoder 40. Thus, last state calculator 160 can include a masking unit such as masking unit 180 that masks irrelevant non-interleaved data bits, wherein irrelevant non-interleaved data bits are data bits that regardless of their value do not affect a final state of a non-interleaved convolutional encoder. Last state calculator 160 may calculate a last state of non-interleaved convolutional encoder 30 based on relevant non-interleaved data bits provided by masking unit 180. Initial state calculator 150 may find a final state of the non-interleaved convolutional encoder 30 based on the last state of the non-interleaved convolutional encoder 30. The final state of the non-interleaved convolutional encoder 30 equals an initial state of the non-interleaved convolutional encoder 40. Initial state calculator 150 initializes the non-interleaved convolutional encoder to the initial state. And non-interleaved convolutional encoder 30 turbo encodes the data bits.

Figure 4:
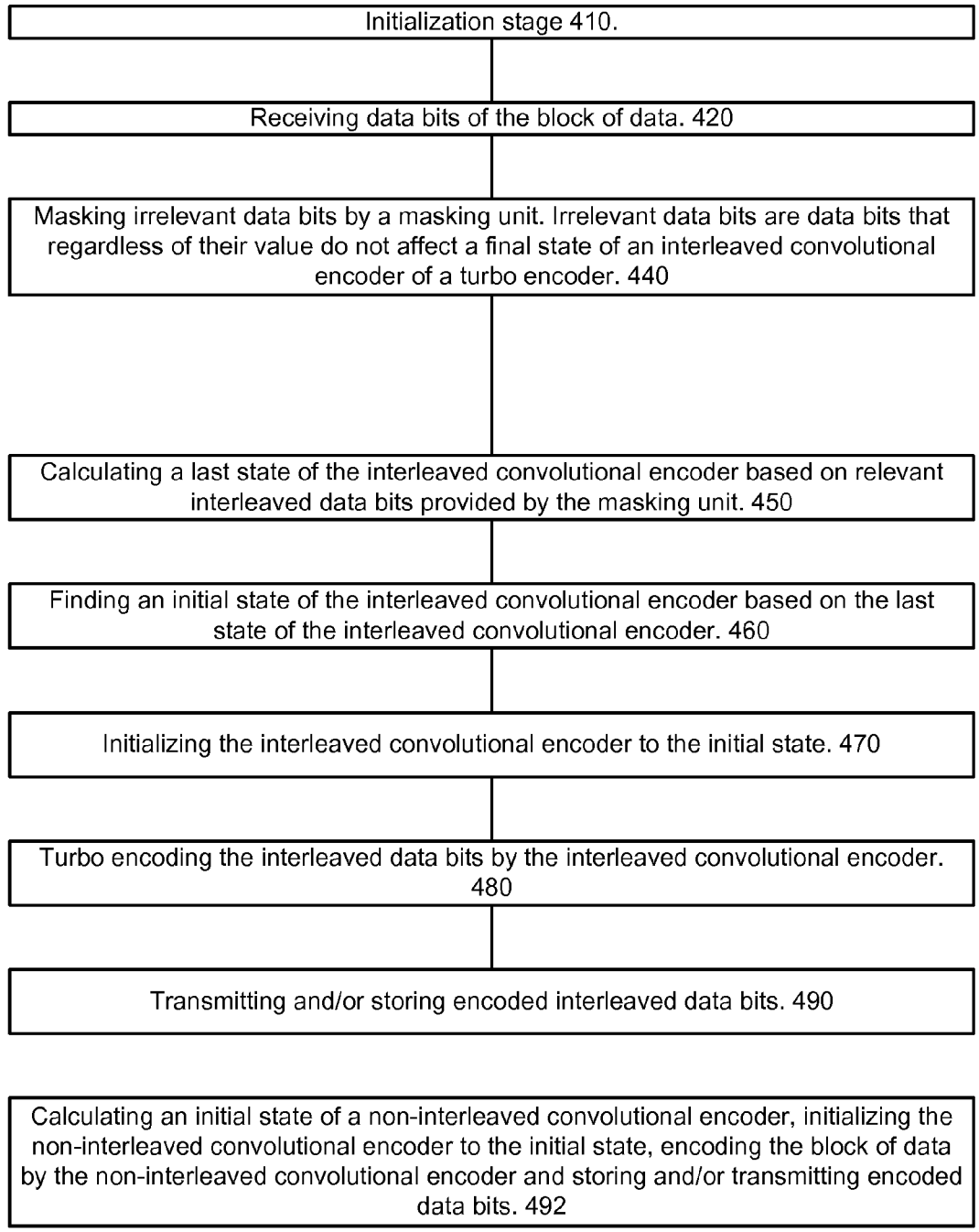
FIG. 4 schematically shows an example of an embodiment of a method for turbo-encoding.

FIG. 4 schematically shows an example of an embodiment of method 400.

Method 400 can be executed by device 100 of FIG. 2.

Method 400 starts with initialization stage 410. Initialization stage 410 can include writing predefined start values to last state calculator.

Stage 410 is followed by stage 420 of receiving data bits of a block of data.

Stage 420 is followed by stage 440 of masking irrelevant data bits by a masking unit. Irrelevant data bits are data bits that regardless of their value do not affect a final state of an interleaved convolutional encoder of a turbo encoder.

Stage 450 is followed by stage 460 of finding an initial state of the interleaved convolutional encoder based on the last state of the interleaved convolutional encoder. The initial state of the interleaved convolutional encoder equals the final state of the interleaved convolutional encoder.

Stage 460 is followed by stage 470 of initializing the interleaved convolutional encoder to the initial state.

Stage 470 is followed by stage 480 of turbo-encoding interleaved data bits by the interleaved convolutional encoder.

Stage 480 is followed by stage 490 of transmitting and/or storing encoded interleaved data bits.

Stages 410-490 are repeated for each block of data.

Stage 450 can include calculating the last state of the interleaved convolutional encoder in a non-iterative manner.

Stage 450 may include independently calculating a last state of each tap of the interleaved convolutional encoder.

Stage 450 can be completed in proximity to a reception of last data bits of the block of data. For example, the calculation can be completed at about the same time the last bits of data are received. The data bits may be received by a buffer that is connected to the turbo encoder. If the bits of data are received and stored in cycles (for example—64 bit batches) then stage 450 can be completed at the same cycle or one or few cycles after the cycle in which the last bits are received.

Method 400 can also include stage 492 of calculating an initial state of a non-interleaved convolutional encoder, initializing the non-interleaved convolutional encoder to the initial state, encoding the block of data by the non-interleaved convolutional encoder and storing and/or transmitting encoded data bits.

Stage 492 can include calculating the last state of the non-interleaved convolutional encoder in a non-iterative manner.

Stage 492 may include independently calculating a last state of each tap of the non-interleaved convolutional encoder.

Stage 492 can be completed in proximity to a reception of last data bits of the block of data. For example, the calculation can be completed at about the same time the last bits of data are received. The data bits may be received by a buffer that is connected to the turbo encoder. If the bits of data are received and stored in cycles (for example—64 bit batches) then stage 440 can be completed at the same cycle or one or few cycles after the cycle in which the last bits are received.

Method 400 can include calculating the finals state of interleaved convolutional encoder and non-interleaved convolutional encoder simultaneously on the same data stream.

If the size of the block of data does not equal an integer multiplication of a mask size (for example—a block of data that has a size that differs from an integer multiplication of 64) the head of the block of data may be padded with zeros such that the last valid data bit is located at the last bit of the last line. It should be noted that this padding should not cause any delay in the stream of data since instead of having a last line of the block of data with less than 64 valid bits the first line of the block of data has less than 64 valid bits. It should be noted that in this case the mask should be reconfigured to mask all zero padding bits, and the masking scheme should be responsive to the presence of the padding bits.

In the following specification, the invention will be described with reference to specific examples of embodiments of the invention. It will, however, be evident that various modifications and changes may be made therein without departing from the broader spirit and scope of the invention as set forth in the appended claims. For example, masking unit can be implemented by an interleaved masking unit and a non-interleaved masking unit. Also, those skilled in the art will recognize that the architectures depicted herein are merely exemplary, and that in fact many other architectures can be implemented which achieve the same functionality. In addition, the devices may be physically distributed over a number of devices, while functionally operating as a single device.

However, other modifications, variations, and alternatives are also possible. The specifications and drawings are, accordingly, to be regarded in an illustrative rather than in a restrictive sense.

The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim comprises the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

We claim:

1. A method for turbo-encoding a block of data, the method comprising:
    receiving data bits of the block of data,
    masking irrelevant data bits by a masking unit, wherein:
        the masking unit includes one or more masks, including a mask per each segment of the block of data, a mask per each tap of an interleaved convolutional encoder of a turbo encoder, a mask per each predefined state of a non-interleaved convolutional encoder, a mask per each size of blocks of data input to the turbo-encoding, or a combination thereof; and
        irrelevant data bits comprise data bits that, regardless of their value, do not affect a final state of the interleaved convolutional encoder of the turbo encoder and irrelevant data bits are determinable by representing a portion of the turbo-encoding as a Boolean algebra expression and selecting data bits whose omission does not affect the Boolean algebra expression as irrelevant data bits;
    calculating a last state of the interleaved convolutional encoder based on relevant data bits provided by the masking unit, wherein
        the calculating of the last state of the interleaved convolutional encoder is initialized before a completion of a reception of the entire block of data;
    finding an initial state of the interleaved convolutional encoder based on the last state of the interleaved convolutional encoder, wherein
        the initial state of the interleaved convolutional encoder equals a final state of the interleaved convolutional encoder;
    initializing the interleaved convolutional encoder to the initial state; and
    turbo-encoding interleaved data bits by the interleaved convolutional encoder.

2. The method according to claim 1 further comprising performing said calculating the last state of the interleaved convolutional encoder without interleaving the data bits.

3. The method according to claim 1 further comprising performing said calculating the last state of the interleaved convolutional encoder in a non-iterative manner.

4. The method according to claim 1 further comprising independently calculating a last state of each tap of the interleaved convolutional encoder.

5. The method according to claim 1 wherein the calculating of the last state of the non-interleaved convolutional encoder is completed in proximity to a reception of last data bits of the block of data.

6. The method according to claim 1 further comprising:
    masking irrelevant non-interleaved data bits by the masking unit, wherein irrelevant non-interleaved data bits are data bits that regardless of their value do not affect a final state of a non-interleaved convolutional encoder;
    calculating a last state of the non-interleaved convolutional encoder based on relevant non-interleaved data bits provided by the masking unit,
        wherein the calculating of the last state of the non-interleaved convolutional encoder is initialized before receiving the entire block of data;
    finding an initial state of the non-interleaved convolutional encoder based on the last state of the non-interleaved convolutional encoder, wherein the initial state of the non-interleaved convolutional encoder equals a final state of the non-interleaved convolutional encoder;
    initializing the non-interleaved convolutional encoder to the initial state; and
    turbo-encoding the data bits by the non-interleaved convolutional encoder.

7. The method according to claim 6 further comprising performing said calculating the last state of the non-interleaved convolutional encoder in a non-iterative manner.

8. The method according to claim 6 further comprising independently calculating a last state of each tap of the non-interleaved convolutional encoder.

9. The method according to claim 6 wherein the calculating of the last state of the non-interleaved convolutional encoder is completed in proximity to a reception of last data bits of the block of data.

10. A device, comprising:
    a turbo encoder that comprises
        an interleaved convolutional encoder configured to encode interleaved data bits of a block of data after being initialized to an initial state; and
        a non-interleaved convolutional encoder;
    a masking unit configured to
        mask irrelevant data bits of the block of data, and
        provide relevant data bits, wherein:
        the masking unit includes one or more masks, including a mask per each segment of the block of data, a mask per each tap of a interleaved convolutional encoder of a turbo encoder, a mask per each predefined state of a non-interleaved convolutional encoder, a mask per each size of blocks of data input to the turbo-encoding, or a combination thereof; and
        irrelevant data bits are data bits that regardless of their value do not affect a final state of the interleaved convolutional encoder, and irrelevant data bits are determinable by representing a portion of the turbo-encoding as a Boolean algebra expression and selecting bits whose omission does not affect the Boolean algebra expression as irrelevant data bits;

a last state calculator, coupled to the turbo encoder and comprising the masking unit, configured to calculate a last state of the interleaved convolutional encoder based on the relevant data bits, wherein the calculating of the last state starts before a completion of a reception of the block of data by the turbo encoder; and an initial state calculator, coupled to the turbo encoder, configured
- to find the initial state of the interleaved convolutional encoder based on the last state of the interleaved convolutional encoder, and
- initialize the interleaved convolutional encoder to the initial state; wherein a final state of the interleaved convolutional encoder equals the initial state of the interleaved convolutional encoder.

11. The device according to claim 10 wherein the last state calculator is further configured to
- receive the data bits, and
- calculate the last state of the interleaved encoder without interleaving the data bits.

12. The device according to claim 10 wherein the last state calculator is further configured to calculate the last state of the interleaved convolutional encoder in a non-iterative manner.

13. The device according to claim 10 wherein the last state calculator is further configured to independently calculate a last state of each tap of the interleaved convolutional encoder.

14. The device according to claim 10 wherein the last state calculator is further configured to complete a calculation of the last state of the interleaved convolutional data encoder in proximity to a reception of last data bits of the block of data.

15. The device according to claim 10, wherein
the masking unit is further configured to
- mask irrelevant non-interleaved data bits, and
- provide relevant non-interleaved data bits wherein irrelevant non-interleaved data bits are data bits that regardless of their value do not affect a final state of the non-interleaved convolutional encoder;

the non-interleaved convolutional encoder turbo is configured to encode the non-interleaved data bits of the block of data after being initialized to an initial state;

the last state calculator is further configured to calculate a last state of the non-interleaved convolutional encoder based on the relevant non-interleaved data bits wherein a calculation of the last state starts before a completion of a reception of the block of data by the turbo encoder; and the initial state calculator is further configured to find the initial state of the non-interleaved convolutional encoder based on the last state of the non-interleaved convolutional encoder, and to initialize the non-interleaved convolutional encoder to the initial state; wherein a final state of the non-interleaved convolutional encoder equals the initial state of the non-interleaved convolutional encoder.

16. The method of claim 1, wherein:
the receiving comprises receiving the data bits of the block of data from an interface;

the interface also provides the data bits of the block of data to a buffer; and the interleaved convolutional encoder does not begin turbo-encoding the interleaved data bits until the block of data is stored in the buffer.

17. The method of claim 1, wherein the determining irrelevant bits comprises determining that a bit b is involved in the portion of the turbo-encoding only as a series of expressions of the form $b \otimes b$, where $\otimes$ represents the exclusive-or operator.

18. The method of claim 6, wherein the masking unit includes a mask per each segment of the block of data.

19. The method of claim 6, wherein the masking unit includes a mask per each tap of the interleaved convolutional encoder.

20. The method of claim 6, wherein the masking unit includes a mask per each predefined state of the non-interleaved convolutional encoder.

\* \* \* \* \*